United States Patent [19]

Kagawa

[11] Patent Number: 5,075,750
[45] Date of Patent: Dec. 24, 1991

[54] AVALANCHE PHOTODIODE WITH ADJACENT LAYERS

[75] Inventor: Toshiaki Kagawa, Kanagawa, Japan

[73] Assignee: Nippon Telegraph and Telephone Corporation, Tokyo, Japan

[21] Appl. No.: 680,960

[22] Filed: Apr. 5, 1991

[30] Foreign Application Priority Data

Apr. 9, 1990 [JP] Japan ................................ 1-92124
Sep. 17, 1990 [JP] Japan ................................ 1-243755

[51] Int. Cl.$^5$ ............................................ H01L 27/14
[52] U.S. Cl. ......................................... 357/30; 357/16; 357/56; 357/4
[58] Field of Search ................. 357/30 A, 30 B, 30 E, 357/4, 16, 56

[56] References Cited

U.S. PATENT DOCUMENTS 4,982,255  1/1991  Tomita ............................. 357/30 A

FOREIGN PATENT DOCUMENTS 1144687  6/1989  Japan ................................ 357/30 A
1194476  8/1989  Japan ................................ 357/30 A
2119274  5/1990  Japan ................................ 357/30 A
2107927  5/1993  United Kingdom ................... 357/4

OTHER PUBLICATIONS

Capasso et al., "Enhancement of Electron Impact Ionization in a Superlattice: A New Avalanche Photodiode with a Large Ionization Rate Ratio," *Appl. Phys. Lett.* 40(1), Jan. 1, 1982, pp. 38–40.

Kagawa, "InGaAs/InAlAs Superlattice Photodiode with a Separated Photoabsorption Layer," *Appl. Phys. Lett.*, 57(18), Oct. 29, '90, pp. 1895–1897.

Kagawa et al., "Impact Ionization Rates in an InGaAs/InAlAs Superlattice", Appl. Phys. Lett. vol. 55, No. 10, Sep. 4, 1989, 1989 American Institute of Physics, pp. 993–995.

Kevin Brennan, "Theoretical Study of Multiquantum Well Avalanche Photodiodes Made from the GaInAs/AlInAs Material System", IEEE Transactions on Electron Devices, vol. ED-33, No. 10, Oct. 1986, pp. 1502–1510.

"Impact Ionisation in Multilayered Heterojunction Structures", Electronics Letters, Jun. 5, 1980, vol. 16, No. 12, pp. 467–469, Chin et al.

*Primary Examiner*—William Mintel
*Attorney, Agent, or Firm*—Blakely, Sokoloff, Taylor & Zafman

[57] ABSTRACT

An avalanche photodiode (APD) includes an InP layer, a carrier multiplication layer, a light-absorbing layer, a light-reflecting layer, and an electrode. The carrier multiplication layer is arranged on one surface of the InP layer and constituted by superlattice in which $In_{0.52}Al_{0.48}As$ layers and $In_xGa_{1-x}As_yP_{1-y}$ layers to be lattice-matched with the $In_{0.52}Al_{0.48}As$ layers are alternately stacked. The light-absorbing layer consists of p-type $In_{0.53}Ga_{0.47}As$. The light-reflecting layer is arranged on an opposite side of the carrier multiplication layer with respect to the InP layer. The electrode is arranged on the other surface of the InP layer and having a light incident window. The light-absorbing layer is arranged adjacent to the carrier multiplication layer.

16 Claims, 4 Drawing Sheets

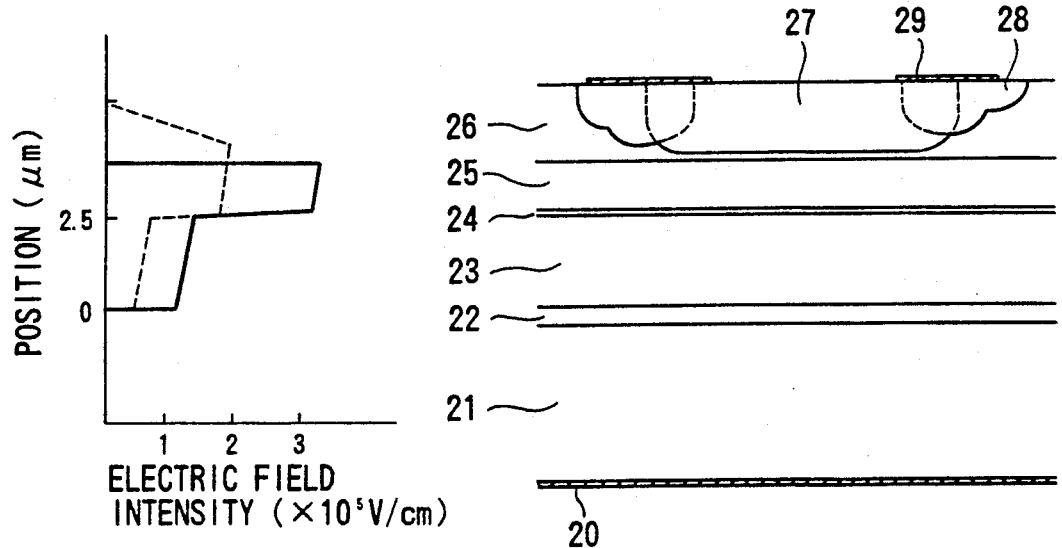
FIG. 2C
FIG. 2A
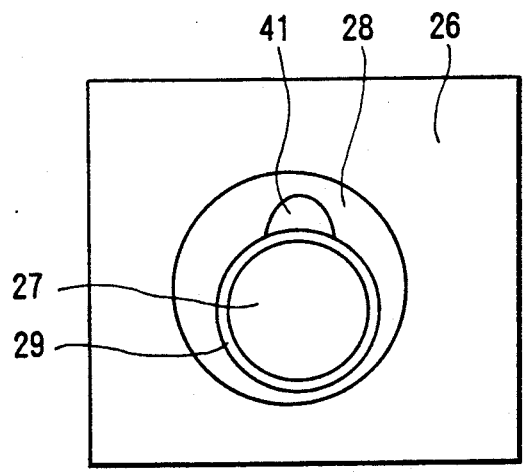
FIG. 2B

AVALANCHE PHOTODIODE WITH ADJACENT LAYERS

BACKGROUND OF THE INVENTION

The present invention relates to an avalanche photodiode (to be referred to as an APD hereinafter) and, more particularly, to an APD used as a photodetector for optical communication.

It is generally known that a noise/gain characteristic or a gain-bandwidth product of an APD mainly depends on a ratio between an electron ionization ratio $\alpha$ and a hole ionization ratio $\beta$ and these characteristics are improved as the ratio $\alpha/\beta$ or $\beta/\alpha$ is increased.

Since this ratio of an APD consisting of Ge or InP used in present optical communication systems is close to 1, its performance is limited in terms of high noise or the like. In order to increase this ratio, it is known that a superlattice obtained by alternately stacking two types of semiconductors can be effectively used. (R. CHIN et al., Electronics Letters, 18,487 (1980) and F. CAPASSO et al., Applied Physics, 40,38 (1982)). In particular, it was found that an ionization ratio of electrons was higher than that of holes by about 20 times in an InGaAs/InAlAs superlattice having large discontinuity in a conduction band, and a method of increasing the $\alpha/\beta$ ratio on the basis of this finding has been proposed. (T. Kagawa et al., Applied Physics Letters No. 55, PP. 993-995 (1989) and K. Brennan, IEEE Transaction, Electron Devices ED-33, 1502 (1986)).

The reported superlattice APD, however, had a structure in which a nondoped InGaAs/InAlAs superlattice was sandwiched between p+-InGaAs and n+-InGaAs having a high impurity concentration (about $1 \times 10^{18}$ cm$^{-2}$) or between similarly heavily doped p+-InAlAs and n+-InAlAs.

In the former structure in which the InGaAs/InAlAs superlattice is sandwiched between p+-InGaAs and n+-InGaAs, light incident from the p+-InGaAs side is absorbed by p+-InGaAs and pairs of electrons and holes are generated in this portion. The generated electrons enter the superlattice to cause multiplication. Since no electric field is applied to p+-InGaAs, these electrons must reach the superlattice by diffusion. This degrades the RF characteristics of an element because the transit of electrons obtained by diffusion is very slow.

On the other hand, in the latter structure in which the InGaAs/InAlAs superlattice is sandwiched between p+-InAlAs and n+-InAlAs, incident light is transmitted through p+-InAlAs and absorbed by the InGaAs/InAlAs superlattice. In this case, since an electric field is applied to the superlattice where electron-hole pairs are generated, no degradation is caused in RF characteristics by diffusion. However, since avalanche multiplication is caused by mixed injection of electrons and holes, the effect of the superlattice structure of improving the ionization ratio is canceled. That is, noise remains large, and a gain-bandwidth product is not improved. (When a multiplication layer in which the ionization ratio of electrons is higher than that of holes is used, neither a reduction in noise level nor an increase in gain-bandwidth product can be achieved unless multiplication of carriers is caused by selectively injecting only electrons into the multiplication layer.)

In addition, in conventional superlattice APDs, since InGaAs/InAlAs is used in a superlattice layer, a high electric field is applied to an InGaAs well layer having a small band gap to allow electrons to flow through this portion by a tunnel effect at a high probability. Therefore, an amount of a dark current is undesirably increased by the tunnel effect. Also, pileup of holes having a large effective mass is caused by discontinuity in a valence band to degrade RF characteristics. Furthermore, since the superlattice layer is not transparent to signal light, a back-surface incident structure cannot be formed.

SUMMARY OF THE INVENTION

It is, therefore, a principal object of the present invention to provide an APD (avalanche photodiode) having improved RF characteristics.

It is another object of the present invention to provide an APD having higher sensitivity than those of conventional APDs.

It is still another object of the present invention to provide an APD which satisfies the above objects of the present invention and can operate at a low operation voltage.

It is still another object of the present invention to provide an APD having high reliability.

In order to achieve the above objects of the present invention, there is provided an APD comprising an n-type InP substrate, a carrier multiplication layer arranged on one surface of the substrate and constituted by a superlattice in which $In_{0.52}Al_{0.48}As$ layers and $In_xGa_{1-x}As_yP_{1-y}$ layers to be lattice-matched to the $In_{0.52}Al_{0.48}As$ layers are alternately stacked, a light-absorbing layer arranged on the carrier multiplication layer and consisting of p-type $In_{0.53}Ga_{0.47}As$, a light-reflecting layer arranged on the light-absorbing layer, and an electrode arranged on the other surface of the substrate and having a light incident window.

BRIEF DESCRIPTION OF THE DRAWINGS

FIG. 2A is a sectional view showing a structure in which the present invention is applied to a planar superlattice APD as another embodiment of the present invention;

FIG. 2B is a plan view showing the APD shown in FIG. 2A;

FIG. 2C is a graph showing an electric field distribution in the direction of thickness of the APD shown in FIG. 2A;

DETAILED DESCRIPTION OF THE PREFERRED EMBODIMENTS

Embodiments of the present invention will be described in detail below with reference to the accompanying drawings.

EMBODIMENT 1

Figure 1C:
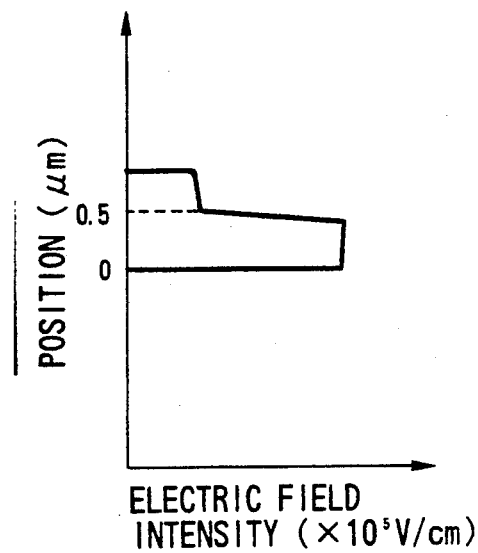
FIG. 1C is a graph showing an electric field distribution in the direction of thickness of the APD shown in FIG. 1A.
Figure 1A:
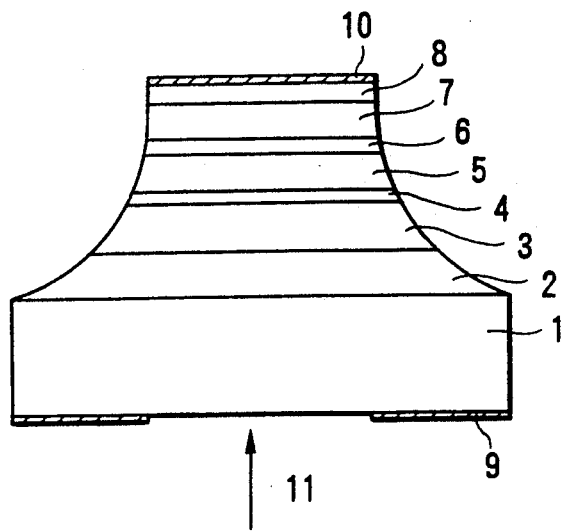
FIG. 1A is a sectional view showing a structure in which the present invention is applied to a mesa superlattice APD as an embodiment of the present invention.
Figure 1B:
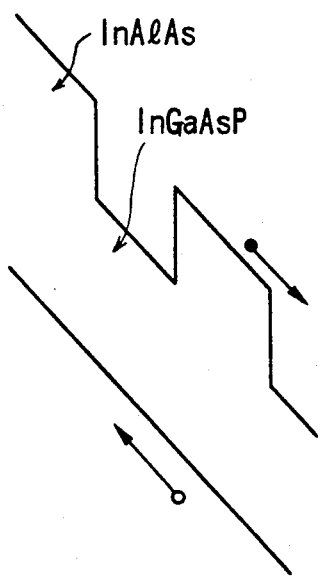
FIG. 1B is a band diagram showing an energy band of a carrier multiplication layer of the APD shown in FIG. 1A.

FIGS. 1A, 1B, and 1C show a mesa superlattice APD as the first embodiment of the present invention. Referring to FIG. 1A, reference numeral 1 denotes an $n^+$-type InP substrate; 2, an $n^+$-type InP buffer layer; 3, a superlattice carrier multiplication layer having a thickness of 0.5 μm and constituted by a nondoped $In_{0.52}Al_{0.48}As$ (thickness=200 Å)/$In_{0.8}Ga_{0.2}As_{0.6}P_{0.4}$ (thickness=200 Å) superlattice; 4, a p-type $In_{0.53}Ga_{0.47}As$ layer having an impurity concentration of Zn or Be of $8 \times 10^{17}$ cm$^{-3}$ and a thickness of 160 Å; 5, a p-type $In_{0.53}Ga_{0.47}As$ layer having an impurity concentration of Zn or Be of $2 \times 10^{15}$ cm$^{-3}$ and a thickness of 1 μm; 6, a p-type $In_{0.53}Ga_{0.47}As$ layer having an impurity concentration of $1 \times 10^{18}$ cm$^{-3}$ and a thickness of 500 Å (or 100 Å); 7, a p-type InP layer having an impurity concentration of $1 \times 10^{18}$ cm$^{-3}$ and a thickness of 0.5 μm; 8, a p-type $In_{0.53}Ga_{0.47}As$ layer having an impurity concentration of $1 \times 10^{18}$ cm$^{-3}$ and a thickness of 300 Å; 9, a ring-like ohmic electrode consisting of AuGeNi; 10, an ohmic electrode consisting of AuZnNi; and 11, a circular light incident window. FIG. 1C shows an electric field intensity in the layers shown in FIG. 1A. In this case, the carrier multiplication layer 3 is formed by alternately stacking $In_{0.52}Al_{0.48}As$ and $In_xGa_{1-x}As_yP_{1-y}$ lattice-match with $In_{0.52}Al_{0.48}As$ and having a band gap of 0.8 eV.

A high electric field is applied to the superlattice carrier multiplication layer 3 to cause avalanche multiplication in this layer. The electric field intensity is weakened in an electric field intensity adjusting layer of the p-type $In_{0.53}Ga_{0.47}As$ layer 4, and an electric field in the light-absorbing layer 5 is much lower than that in the superlattice carrier multiplication layer 3. Therefore, occurrence of avalanche multiplication or a tunnel current in this portion is suppressed. The electric field disappears in the InGaAs layer 6 having a high impurity concentration. The InP layer 7 prevents surface recombination on the InGaAs layer 6, and the InGaAs layer 8 is a layer for an ohmic electrode. The AuZnNi electrode 10 serves as both an ohmic electrode and a light-reflecting layer.

Light is incident from the light incident window 11 formed in the AuGeNi electrode 9, is transmitted through the InP substrate 1, the InP buffer layer 2, and the superlattice carrier multiplication layer 3, and is absorbed by the InGaAs layers 4, 5, and 6 having small energy band gaps. Since the total thickness of the InGaAs layers 4, 5, and 6 is smaller than a reciprocal (about 2 μm) of an absorption coefficient $\alpha_{av}$ of light, not all of photons are absorbed but some of them are transmitted to the electrode 10. These transmitted photons are reflected by the electrode 10 and returned to the light-absorbing layer 5. Therefore, the effective thickness of the light-absorbing layer 5 is doubled to absorb almost all the photons. Pairs of electrons and holes are generated by this light absorption, and the generated electrons are moved by the electric field applied to the InGaAs layer 5 and are injected into the superlattice carrier multiplication layer 3. Since a large amount of electrons are generated in a portion near the carrier multiplication layer 3 because the light is incident from the carrier multiplication layer 3, a transit distance of electrons to the carrier multiplication layer 3 is shortened to increase a response speed.

FIG. 1B shows an energy band of the superlattice carrier multiplication layer of the APD of this embodiment. In a superlattice in which a barrier layer consists of InAlAs and a well layer consists of InGaAsP, discontinuity in a valence band can be made zero while that in a conduction band remains large. Therefore, the electrons acquire a kinetic energy from the discontinuity of the conduction band to increase their ionization ratio. On the other hand, holes can smoothly transit in spite of their large effective mass because the discontinuity of the valance band is zero.

In the APD having the above structure, therefore, a quantum efficiency is not decreased although the light-absorbing layer 5 is thin. In addition, in a superlattice APD where the ionization ratio of electrons is much higher than that of holes, multiplication caused by pure electron injection which is an essential condition of reducing multiplication noise can be realized, and degradation in RF characteristics caused by diffusion can be prevented because the electrons in the light-absorbing layer are swept by a weak electric field.

A voltage applied to the APD is used to apply an electric field to the superlattice carrier multiplication layer 3 and the $In_{0.53}Ga_{0.47}As$ layer 5 light-absorbing layers. In this embodiment, since the thickness of the light-absorbing layer 5 can be halved, an electric field can be applied to the light-absorbing layer at a low voltage, and an operation voltage can be decreased accordingly.

EMBODIMENT 2

FIGS. 2A and 2B show a planar superlattice APD according to the second embodiment of the present invention. Referring to FIGS. 2A and 2B, reference numeral 21 denotes a Zn- or Be-doped $p^+$-type InP substrate; 22, a Zn- or Be-doped $p^+$-type InP buffer layer; 23, a p-type $In_{0.53}Ga_{0.47}As$ layer having a Be impurity concentration of $2 \times 10^{15}$ cm$^{-3}$ and a thickness of 2 μm; 24, a p-type $In_{0.53}Ga_{0.47}As$ electric field intensity adjusting layer having a Be impurity concentration of $8 \times 10^{17}$ cm$^{-3}$ and a thickness of 160 Å; 25, a 0.5-μm thick superlattice carrier multiplication layer constituted by a p-type $In_{0.52}Al_{0.48}As$ (thickness=200 Å)/$In_{0.8}Ga_{0.2}As_{0.6}P_{0.4}$ (thickness=200 Å) superlattice having a Be impurity concentration of $2 \times 10^{15}$ cm$^{-3}$; 26, a p-type InP layer having an impurity concentration of $2 \times 10^{15}$ cm$^{-3}$ and a thickness of 0.3 μm; 27, an Si-doped high-concentration n-type InP region having an impurity concentration of $1 \times 10^{18}$ cm$^{-3}$; 28, an Si-doped low-concentration n-type InP region having an Si impurity concentration of $1 \times 10^{16}$ cm$^{-3}$; 29, an ohmic electrode consisting of AuGeNi; and 20, an ohmic electrode consisting of AuZnNi.

FIG. 2B shows an arrangement of the APD of this embodiment viewed from the above. Referring to FIG. 2B, the low-concentration Si-doped region 28 surrounds the circumference of the circular high-concentration Si-doped region 27, and the ring-like electrode 29 is formed across the two regions. Reference numeral 41 denotes a bonding pad.

FIG. 2C illustrated at the left side of FIG. 2A shows an electric field intensity distribution in the layers shown in FIG. 2A. Referring to FIG. 2C, a solid line indicates an electric field intensity distribution in the layers located below the high-concentration Si-doped region 27; and a broken line, that in the layers located below the low-concentration Si-doped region 28 formed around the high-concentration Si-doped region 27. In the electric field intensity distribution indicated by the solid line, a high electric field is applied to the superlattice carrier multiplication layer 25 to cause avalanche multiplication in this layer. The electric field intensity is weakened in the p-type $In_{0.53}Ga_{0.47}As$ electric field intensity adjusting layer 24, and the electric field in the light-absorbing layer 23 is much lower than that in the superlattice carrier multiplication layer 25. Therefore, occurrence of avalanche multiplication or a tunnel current is suppressed in the light-absorbing layer 23. Signal light is incident on the light-absorbing layer 23 through a window formed inside the ring-like electrode 29. Electrons generated in the light-absorbing layer 23 are swept toward the superlattice carrier multiplication layer 25 by the electric field applied on this layer and induce multiplication of carriers in this layer. Therefore, when light is incident on the high-concentration Si-doped region 27 having the electric field intensity distribution indicated by the solid line, a large photocurrent is flowed by the avalanche multiplication.

In the electric field intensity distribution indicated by the broken line, on the other hand, since the dose of Si is small, the low-concentration Si-doped region 28 is depleted. And the application voltage is divided into this low-concentration Si-doped region 28 and the superlattice carrier multiplication layer 25. Therefore, the electric field intensity in the superlattice carrier multiplication layer 25 is lower than that in the superlattice carrier multiplication layer 25 located below the high-concentration Si-doped region 27. In addition, as shown in FIG. 2A, below the low-concentration Si-doped region 28, since a p-n junction is formed between the low-concentration Si-doped region 28 in the InP layer having a large energy band gap and the p-type InP region 26, the highest electric field is applied to this portion. In general, the larger the energy band gap of a semiconductor, the higher the avalanche breakdown electric field. For this reason, the avalanche breakdown voltage of the low-concentration Si-doped region 28 is much higher than that of the high-concentration Si-doped region 27. Therefore, this low-concentration Si-doped region 28 suppresses edge breakdown to serve as a guard ring. Note that although a structure from which the guard ring junction is omitted may be formed, the guard ring junction is preferably formed in a practical arrangement because the edge breakdown is easily caused if not formed.

EMBODIMENT 3

Figure 3C:
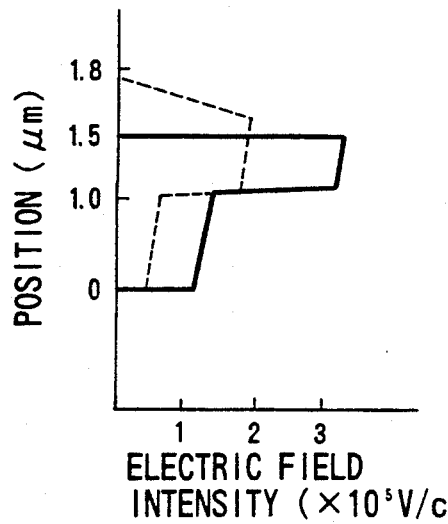
FIG. 3C is a graph showing an electric field distribution in the direction of thickness of the APD shown in FIG. 3A.
Figure 3A:
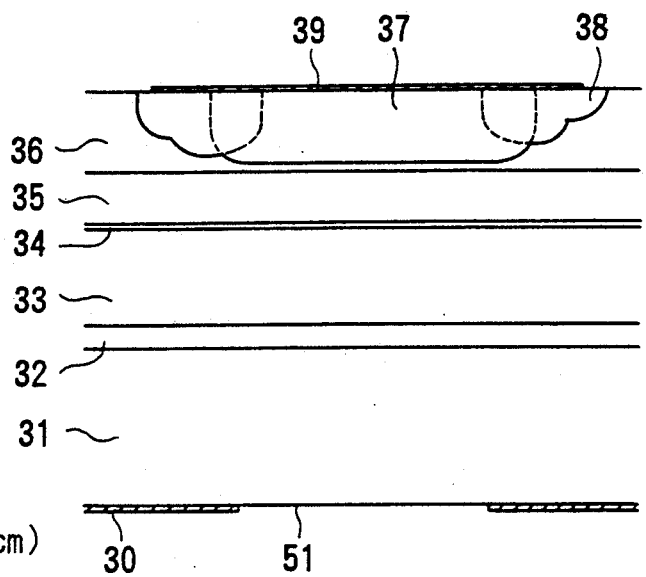
FIG. 3A is a sectional view showing a structure in which the present invention is applied to another planar superlattice APD as still another embodiment of the present invention.
Figure 3B:
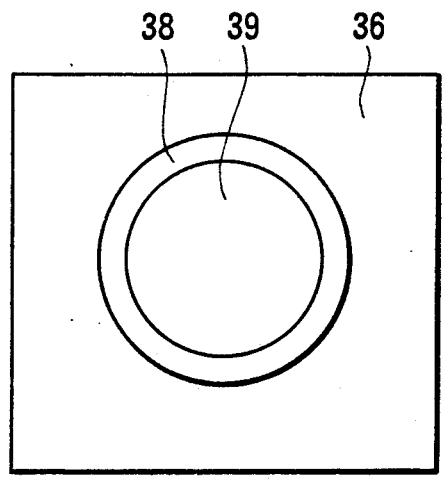
FIG. 3B is a plan view showing the APD shown in FIG. 3A.

FIGS. 3A, 3B, and 3C show a planar superlattice APD according to the third embodiment of the present invention. Referring to FIGS. 3A and 3B, reference numeral 31 denotes a p$^+$-type InP substrate; 32, a p$^+$-type InP buffer layer; 33, a p-type $In_{0.53}Ga_{0.47}As$ light-absorbing layer having a Be impurity concentration of $2 \times 10^{15}$ cm$^{-3}$ and a thickness of 1 μm; 34, a p-type $In_{0.53}Ga_{0.47}As$ electric field intensity adjusting layer having a Be impurity concentration of $8 \times 10^{17}$ cm$^{-3}$ and a thickness of 100 Å; 35, a 1-μm thick superlattice carrier multiplication layer constituted by a p-type $In_{0.52}Al_{0.48}As$ (thickness=200 Å)/$In_{0.8}Ga_{0.2}As_{0.6}P_{0.4}$ (thickness=200 Å) superlattice having a Be impurity concentration of $2 \times 10^{15}$ cm$^{-3}$; 36, a p-type InP layer having a Be impurity concentration of $2 \times 10^{15}$ cm$^{-3}$ and a thickness of 0.3 μm; 37, an Si-doped high-concentration n-type InP region having an impurity concentration of $1 \times 10^{18}$ cm$^{-3}$; 38, an Si-doped low-concentration n-type InP region having a Be impurity concentration of $1 \times 10^{16}$ cm$^{-3}$; 39, an ohmic electrode consisting of AuGeNi; 30, an ohmic electrode consisting of AuZnNi; 51, a light incident window formed in the AuZnNi electrode 30. The AuGeNi electrode 39 also serves as a light-reflecting film.

FIG. 3B shows an arrangement of the APD of this embodiment viewed from the above. Referring to FIG. 3B, the low-concentration Si-doped region 38 surrounds the circumference of the circular high-concentration Si-doped region 37, and the circular electrode 39 also serving as a light-reflecting film is formed across the two regions.

FIG. 3C illustrated at the left side of FIG. 3A shows an electric field intensity distribution in the layers shown in FIG. 3A. Referring to FIG. 3C, a solid line indicates an electric field intensity distribution in the layers located below the high-concentration Si-doped region 37; and a broken line, that in the layers located below the low-concentration Si-doped region 38 formed around the high-concentration Si-doped region 37. In the electric field intensity distribution indicated by the solid line in FIG. 3C, a high electric field is applied to the superlattice multiplication layer 35 to cause avalanche multiplication in this layer. The electric field intensity is weakened in the p-type $In_{0.53}Ga_{0.47}As$ electric field intensity adjusting layer 34, and an electric field in the light-absorbing layer 33 is much lower than that in the superlattice carrier multiplication layer 35. Therefore, occurrence of avalanche multiplication or a tunnel current can be suppressed. Signal light is incident on the light-absorbing layer 33 through the light incident window 51. Electrons generated in the light-absorbing layer 33 are swept toward the superlattice carrier multiplication layer 35 by the electric field applied on this layer to induce multiplication of carriers in this layer. Therefore, when light is incident on the high-concentration Si-doped region 37 having the electric field intensity distribution indicated by the solid line, a large photocurrent is flowed by the avalanche multiplication.

In the electric field intensity distribution indicated by the broken line in FIG. 3C, on the other hand, since the dose of Si is small, the low-concentration Si-doped region 38 is depleted. And the application voltage is divided into this low-concentration Si-doped region 38 and the superlattice carrier multiplication layer 35. Therefore, the electric field intensity of the superlattice carrier multiplication layer 35 is lower than that indicated by the solid line in the superlattice carrier multiplication layer 35 located below the high-concentration Si-doped region 37. In addition, as shown in FIG. 3A, below the low-concentration Si-doped region 38, since a p-n junction is formed between the low-concentration Si-doped region 38 in the InP layer having the large energy band gap and the p-type InP region 36, the highest electric field is applied to this portion. In general, the larger the energy band gap of a semiconductor, the higher the avalanche breakdown electric field. For this reason, the avalanche breakdown voltage in the low-concentration Si-doped region 38 is much higher than that in the high-concentration Si-doped region 37. Therefore, this low-concentration Si-doped region 38 suppresses edge breakdown to serve as a guard ring.

In this embodiment, light is incident from the light incident window 51, transmitted through the InP substrate 31 and the InP buffer layer 32, and absorbed by the InGaAs light-absorbing layer 33 having a small energy band gap. Since the thickness of this InGaAs light-absorbing layer 33 is smaller than a reciprocal of an absorption coefficient $a_{av}$ of light (about 2 μm), not all of photons are absorbed but some of them reach the superlattice carrier multiplication layer 35. This energy band gap is transparent because it is larger than the photon energy of the signal light. Therefore, the photons are further transmitted through the InP layers 36 and 37 and reflected by the light-reflecting layer 39 to return to the light-absorbing layer 33. Therefore, since the effective thickness of the light-absorbing layer is doubled, almost all the photons are absorbed. This light absorption generates pairs of electrons and photons, and the generated electrons are moved by the electric field applied in the InGaAs light-absorbing layer 33 and injected in the superlattice carrier multiplication layer 35. As a result, since the light-absorbing layer can be formed thin without decreasing a quantum efficiency, a transit time of carriers can be shortened, and an operation voltage can be decreased.

In addition, in the APD of this embodiment, since the electrode 39 is not formed to have a ring-like shape as in the second embodiment but formed to cover substantially the entire Si-doped region as shown in FIG. 3B, any additional bonding pad need not be provided. Therefore, an area of an element can be decreased, and a small element capacitance is realized. This advantage also realizes a high-speed response. Note that although a structure from which the guard ring junction is omitted may be formed, the guard ring junction is preferably formed in a practical arrangement because the edge breakdown is easily caused if not formed.

The present invention has been described in detail above on the basis of the preferred embodiments. However, the present invention is not limited to the above embodiments but can be variously modified without departing from the spirit and scope of the invention.

Figure 4B:
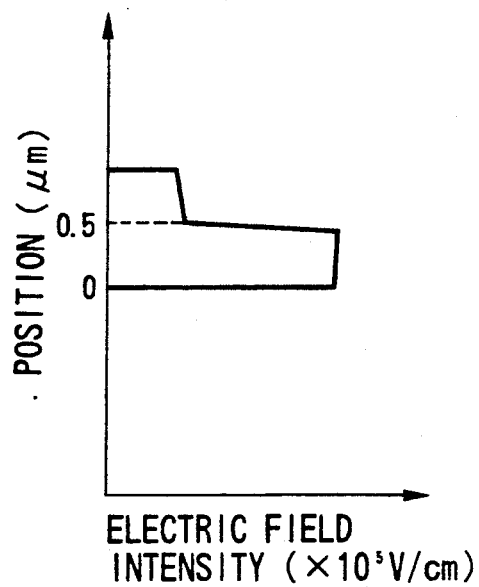
FIG. 4B is a graph showing an electric field distribution in the direction of thickness of the APD shown in FIG. 4A.
Figure 4A:
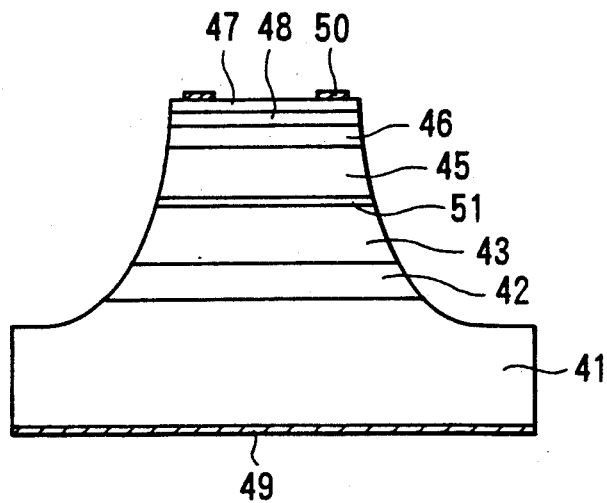
FIG. 4A is a sectional view showing a structure in which the present invention is applied to another mesa superlattice APD as still another embodiment of the present invention.

FIGS. 4A and 4B show still another embodiment of the present invention. Referring to FIGS. 4A and 4B, reference numeral 41 denotes an n+-type InP substrate; 42, an n+-type InP buffer layer; 43, a nondoped $In_{0.52}Al_{0.48}As/In_{0.8}Ga_{0.2}As_{0.6}P_{0.4}$ superlattice; 51, a p-type $In_{0.52}Al_{0.48}As$ layer having an impurity concentration of $8 \times 10^{17}$ cm$^{-3}$ and a thickness of 160 Å; 45, a p-type $In_{0.53}Ga_{0.47}As$ layer having an impurity concentration of $2 \times 10^{15}$ cm$^{-3}$ and a thickness of 2 μm; 46, a p-type $In_{0.53}Ga_{0.47}As$ layer having an impurity concentration of $1 \times 10^{18}$ cm$^{-3}$ and a thickness of 500 Å; 47, a p-type InP layer having an impurity concentration of $1 \times 10^{18}$ cm$^{-3}$ and a thickness of 1,000 Å; 48, a p-type $In_{0.53}Ga_{0.53}As$ layer having an impurity concentration of $1 \times 10^{18}$ cm$^{-3}$ and a thickness of 1,000 Å; and 49 and 50, ohmic electrodes consisting of AuGeNi and AuZnNi, respectively. The thickness of the superlattice carrier multiplication layer 43 is 0.52 μm, that of the $In_{0.8}Ga_{0.2}As_{0.6}P_{0.4}$ well layer is 200 Å, that of the $In_{0.52}Al_{0.48}As$ is 200 Å, and the period of the superlattice is 13.

FIG. 4B illustrated at the left side of FIG. 4A shows an electric field intensity distribution of the layers shown in FIG. 4A. Referring to FIG. 4B, the highest electric field is applied to the superlattice layer 43 to cause avalanche multiplication in this layer. The InGaAs layer 45 serves as a light-absorbing layer, and the electric field intensity in this layer is weakened by the thin p-type InAlAs layer 50.

InP denoted by reference numeral 47 serves as a window layer for preventing surface recombination.

Since a high electric field is applied on the superlattice multiplication layer, InGaAsP is used in the well layer of the multiplication layer to increase the band gap in this portion to suppress a dark current caused by a tunnel effect. Since the light-absorbing layer must have a small band gap to absorb signal light having a wavelength of 1.55 μm, $In_{0.52}Ga_{0.48}As$ is used. Therefore, to suppress the tunnel effect in this portion, the electric field intensity must be decreased below $1.5 \times 10^5$ V/cm. Decreasing the electric field intensity in the electric field intensity adjusting layer prevents avalanche breakdown in the light-absorbing layer and suppresses the tunnel effect.

On the other hand, although the electric field intensity in the electric field intensity adjusting layer 51 abruptly changes, a high electric field intensity on the superlattice multiplication layer side of this layer generates a tunnel current. To prevent this, InAlAs having a large band gap is used in the electric field intensity adjusting layer in the present invention.

Figure 5:
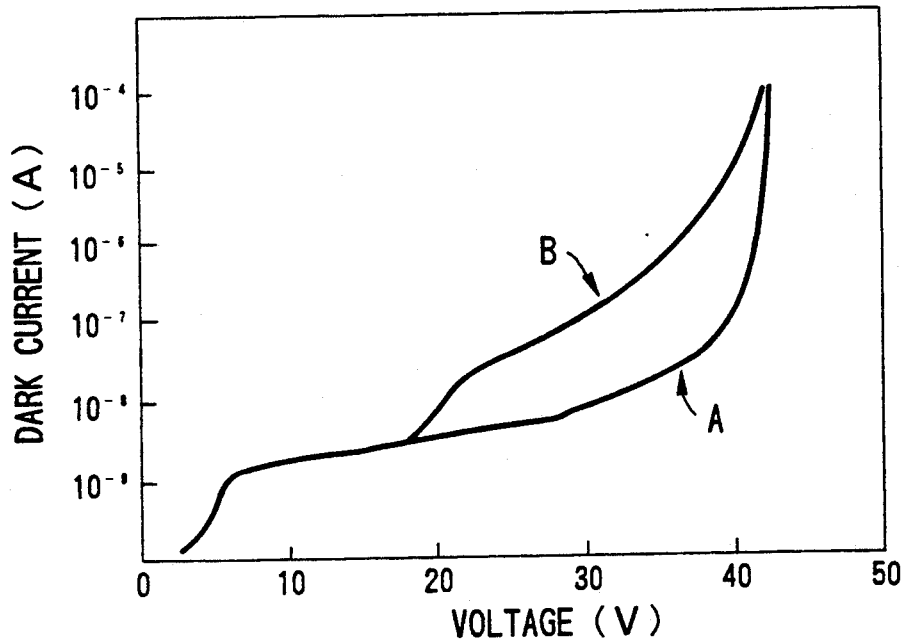
FIG. 5 is a graph showing dark current characteristics of the APD shown in FIG. 4A.

FIG. 5 compares a dark current of the element according to the embodiment shown in FIGS. 4A and 4B with that of a conventional element in which InGaAs is used in an electric field intensity adjusting layer. Referring to FIG. 5, characteristic curves A and B indicate the dark current of the element of the present invention and that of the conventional element, respectively. When a voltage is less than 20 V, since only the superlattice layer is depleted and no electric field is applied to the electric field intensity adjusting layer or the light-absorbing layer, the dark currents of the two elements are the same. When a bias of 20 V or more is applied, these layers are depleted, and an electric field is applied on the electric field intensity adjusting layer. Therefore, in the conventional element, the dark current is increased stepwise due to a tunnel effect in this layer. In contrast to this, in the element according to the present invention, such an increase in dark current is not found, but the dark current is smaller than that in the conventional element.

Although $In_{0.52}Al_{0.48}As$ is used in the electric field intensity adjusting layer in this embodiment, $In_xGa_{1-x}As_yP_{1-y}$ (including InP) having a larger band gap than that of $In_{0.53}Ga_{0.47}As$ can be similarly used to obtain the same effects.

In the APD of the present invention, InGaAsP having a large energy band gap and large discontinuity in a conduction band with respect to InAlAs is used as a well layer in a superlattice carrier multiplication layer. Therefore, a dark current can be reduced. In addition, in the superlattice carrier multiplication layer according to the present invention, discontinuity in the valance band can be made zero while that in the conduction band remains large. Electrons, therefore, acquire kinetic energy from the discontinuity in the valance band to increase their ionization ratio. And holes can smoothly transit to increase a response speed. Furthermore, since the carrier multiplication layer using a superlattice is separated from the p-type InGaAs light-absorbing layer, multiplication caused by pure electron injection which is an essential condition of reducing multiplication noise can be realized in a superlattice APD in which the ionization ratio of electrons is much higher than that of holes. Also, since an electric field having a suitable intensity is applied to the light-absorbing layer, electrons generated by light absorption can be rapidly swept to prevent degradation in RF characteristics caused by diffusion.

In the APD of the present invention, the light incident window is formed in the electrode provided on the InP substrate side, the light-reflecting film is formed on the element on the opposite side of the substrate, and the thickness of the light-absorbing layer is decreased to be 1.5 μm or less (Embodiments 1 and 3). Therefore, light is incident from the light incident window on the substrate side, transmitted through the substrate and the superlattice carrier multiplication layer, and absorbed by the light-absorbing layer having a small energy band gap. Since the light-absorbing layer is made thin, not all of photons are absorbed but some of them are transmitted to the electrode formed on the opposite side of the InP substrate. However, these photons are reflected by the electrode also serving as a light-reflecting layer and returned to the light-absorbing layer. Therefore, the effective thickness of the light-absorbing layer is doubled to absorb almost all the photons. Pairs of electrons and holes are generated by this light absorption, and the generated electrons are moved by an electric field applied to the light-absorbing layer and injected in the carrier multiplication layer constituted by a superlattice. Since a transit distance of the electrons to the superlattice multiplication layer is shortened due to the thin light-absorbing layer, RF characteristics can be improved and at the same time an operation voltage is decreased. In Embodiments 1 and 2 in each of which light is transmitted through the superlattice layer, which is transparent to incident light, and absorbed by the light-absorbing layer, a large amount of electrons are generated in a portion near the carrier multiplication layer because the light is incident from the carrier multiplication layer. Therefore, the transit distance of electrons to the carrier multiplication layer is shortened to further increase the response speed.

Moreover, the planar APD of the present invention advantageously has high reliability since a p-n junction to which a high electric field is applied is not exposed outside unlike in a mesa APD.

As has been described above, according to the APD of the present invention, a high-speed operation and a small dark current can be realized without degrading noise characteristics. In addition, a highly reliable planar element can be provided in such an APD.

What is claimed is:

1. An avalanche photodiode (APD) comprising:
   an InP layer;
   a carrier multiplication layer arranged on one surface of said InP layer and constituted by a superlattice in which $In_{0.52}Al_{0.48}As$ layers and $In_xGa_{1-x}As_yP_{1-y}$ layers to be lattice-matched with said $In_{0.52}Al_{0.48}As$ layers are alternately stacked;
   a light-absorbing layer consisting of p-type $In_{0.53}Ga_{0.47}As$ arranged adjacent to said carrier multiplication layer;
   a light-reflecting film arranged on an opposite side of said carrier multiplication layer with respect to said InP layer; and
   an electrode arranged on the other surface of said InP layer and having a light incident window.

2. An APD according to claim 1, wherein said $In_xGa_{1-x}As_yP_{1-y}$ layer of said carrier multiplication layer has an energy band gap of more than 0.8 eV.

3. An APD according to claim 1, wherein said p-type $In_{0.53}Ga_{0.47}As$ of said light-absorbing layer has a thickness of not more than 10.5 μm.

4. An APD according to claim 1, wherein said APD is of a mesa type.

5. An APD according to claim 1, wherein said APD is of a planar type.

6. An APD according to claim 1, wherein said light-absorbing layer is arranged between said carrier multiplication layer and said reflecting film.

7. An APD according to claim 1, further comprising another p-type InP layer formed between said light-absorbing layer and said reflecting film.

8. An APD according to claim 7, further comprising an n-type region doped with an n-type impurity and formed in a portion of said p-type InP layer.

9. An APD according to claim 7, wherein said reflecting film is adhered on an upper surface of said n-type InP layer.

10. An APD according to claim 1, wherein said first InP layer is an n-type substrate.

11. An APD according to claim 1, wherein said first InP layer is a p-type InP substrate.

12. An APD according to claim 8, further comprising a region formed around said n-type region and having an impurity concentration lower than that of said n-type region.

13. An avalanche photodiode (APD) comprising:
   an InP layer;
   a carrier multiplication layer arranged on one surface of said InP layer and constituted by a superlattice in which $In_{0.52}Al_{0.48}As$ layers and $In_xGa_{1-x}As_yP_{1-y}$ layers to be lattice-matched with said $In_{0.52}Al_{0.48}As$ layers are alternately stacked;
   an electric field intensity adjusting layer arranged adjacent to said carrier multiplication layer;
   a light-absorbing layer consisting of p-type $In_{0.53}Ga_{0.47}As$ arranged adjacent to said electric field intensity adjusting layer;
   a light-reflecting layer arranged on an opposite side of said carrier multiplication layer with respect to said InP layer; and
   an electrode arranged on the other surface of said InP layer and having a light incident window.

14. An APD according to claim 13, wherein said electric field intensity adjusting layer consists of p-type $In_{0.53}Ga_{0.47}As$.

15. An APD according to claim 13, wherein said electric field intensity adjusting layer consists of p-type $In_{0.52}Al_{0.48}As$.

16. An APD according to claim 13, wherein said electric field intensity adjusting layer consists of p-type $In_xGa_{1-x}As_yP_{1-y}$.

* * * * *

UNITED STATES PATENT AND TRADEMARK OFFICE
CERTIFICATE OF CORRECTION

PATENT NO. : 5,075,750
DATED : December 24, 1991
INVENTOR(S) : Kagawa

It is certified that error appears in the above-identified patent and that said Letters Patent is hereby corrected as shown below:

In column 3 at lines 21-22 replace "$In_{0.52}Al_{0.48}As$"
with --$In_{0.52}Al_{0.48}As$--;

In column 4 at line 35 after "layer 5"
insert --having a lower impurity concentration of the--;

In claim 3 in column 10 at line 14 replace "$10.5\mu m$"
with --$1.5\mu m$--;

In claim 10 in column 10 at line 32 after "an n-type"
insert --InP--.

Signed and Sealed this

Twenty-sixth Day of September, 1995

Attest:

BRUCE LEHMAN

Attesting Officer     Commissioner of Patents and Trademarks